US010208377B2

(12) United States Patent
Matthews et al.

(10) Patent No.: US 10,208,377 B2
(45) Date of Patent: Feb. 19, 2019

(54) LOCALIZED ATMOSPHERIC LASER CHEMICAL VAPOR DEPOSITION

(71) Applicant: LAWRENCE LIVERMORE NATIONAL SECURITY, LLC, Livermore, CA (US)

(72) Inventors: Manyalibo Joseph Matthews, Livermore, CA (US); Selim Elhadj, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 14/389,709

(22) PCT Filed: Apr. 19, 2013

(86) PCT No.: PCT/US2013/037416
§ 371 (c)(1),
(2) Date: Sep. 30, 2014

(87) PCT Pub. No.: WO2013/163040
PCT Pub. Date: Oct. 31, 2013

(65) Prior Publication Data
US 2015/0064363 A1 Mar. 5, 2015

Related U.S. Application Data

(60) Provisional application No. 61/637,205, filed on Apr. 23, 2012.

(51) Int. Cl.
C23C 16/02 (2006.01)
C23C 16/04 (2006.01)
(Continued)

(52) U.S. Cl.
CPC .......... *C23C 16/047* (2013.01); *C03C 17/245* (2013.01); *C23C 16/0263* (2013.01);
(Continued)

(58) Field of Classification Search
CPC ..... C23C 16/047; C23C 16/483; C23C 16/46; C23C 16/4488; C23C 16/0263;
(Continued)

(56) References Cited

U.S. PATENT DOCUMENTS 4,411,678 A 10/1983 Arai
4,987,855 A 1/1991 Ahlgren
(Continued)

FOREIGN PATENT DOCUMENTS

GB 2212819 A * 8/1989 ........... C23C 16/047
JP 57163204 10/1982
(Continued)

OTHER PUBLICATIONS

Park, J. B. et al. "Hybrid LCVD of micro-metallic lines for TFT-LCD circuit repair", Applied Surface Science, Elsevier, Amsterdam, NL, Vo. 253, No. 2, Nov. 15, 2006, pp. 1029-1035, XP024893698, ISSN: 0169-4332, DOI: 10.1016/J.APSUSC.2006.06.054 [retrieved on Nov. 15, 2006].
(Continued)

*Primary Examiner* — Dah-Wei D. Yuan
*Assistant Examiner* — Jose Hernandez-Diaz
(74) *Attorney, Agent, or Firm* — Harness, Dickey & Pierce, PLC

(57) ABSTRACT

An atmospheric, Laser-based Chemical Vapor Deposition (LCVD) technique provides highly localized deposition of material to mitigate damage sites on an optical component. The same laser beam can be used to deposit material as well as for in-situ annealing of the deposited material. The net result of the LCVD process is in-filling and planarization of a treated site, which produces optically more damage resistant surfaces. Several deposition and annealing steps can be interleaved during a single cycle for more precise control on
(Continued)

amount of deposited material as well as for increasing the damage threshold for the deposited material.

18 Claims, 9 Drawing Sheets

(51) Int. Cl.
- C23C 16/46 (2006.01)
- C23C 16/48 (2006.01)
- C23C 16/52 (2006.01)
- C03C 17/245 (2006.01)
- C23C 16/448 (2006.01)
- H01L 21/268 (2006.01)

(52) U.S. Cl.
CPC .......... *C23C 16/4488* (2013.01); *C23C 16/46* (2013.01); *C23C 16/483* (2013.01); *C23C 16/52* (2013.01); *H01L 21/268* (2013.01); *C03C 2217/213* (2013.01); *C03C 2218/152* (2013.01)

(58) Field of Classification Search
CPC ..... C23C 16/52; H01L 21/268; C03C 17/245; C03C 2218/152; C03C 2217/213
See application file for complete search history.

(56) References Cited

U.S. PATENT DOCUMENTS

| | | | |
|---|---|---|---|
| 5,405,481 A | 4/1995 | Licoppe et al. | |
| 5,622,567 A * | 4/1997 | Kojima | C23C 14/022 118/726 |
| 6,879,605 B2 | 4/2005 | Kyusho et al. | |
| 7,815,981 B2 | 10/2010 | Iwanaga et al. | |
| 2002/0070198 A1* | 6/2002 | Brusasco | C03C 15/00 216/24 |
| 2005/0220165 A1 | 10/2005 | Caprara et al. | |
| 2006/0275537 A1* | 12/2006 | Maxwell | C23C 16/4418 427/8 |
| 2008/0203326 A1* | 8/2008 | Neukirch | G02B 1/00 250/504 R |
| 2010/0163434 A1 | 7/2010 | Smith, Jr. | |
| 2010/0310759 A1 | 12/2010 | Lee et al. | |
| 2012/0006796 A1* | 1/2012 | Demos | B23K 26/0039 219/121.66 |
| 2013/0013955 A1 | 1/2013 | Wang et al. | |
| 2013/0139551 A1* | 6/2013 | Adams | C03C 23/0025 65/28 |

FOREIGN PATENT DOCUMENTS

| | | |
|---|---|---|
| JP | 01241503 | 9/1989 |
| JP | 0340434 | 2/1991 |

OTHER PUBLICATIONS

European Patent Office Communication pursuant to Article 94(3) EPC dated Jun. 27, 2016, 13 pages.

International Search Report and Written Opinion of International Searching Authority for corresponding International Application No. PCT/US13/37416 dated Jul. 29, 2013, 8 pages.

* cited by examiner

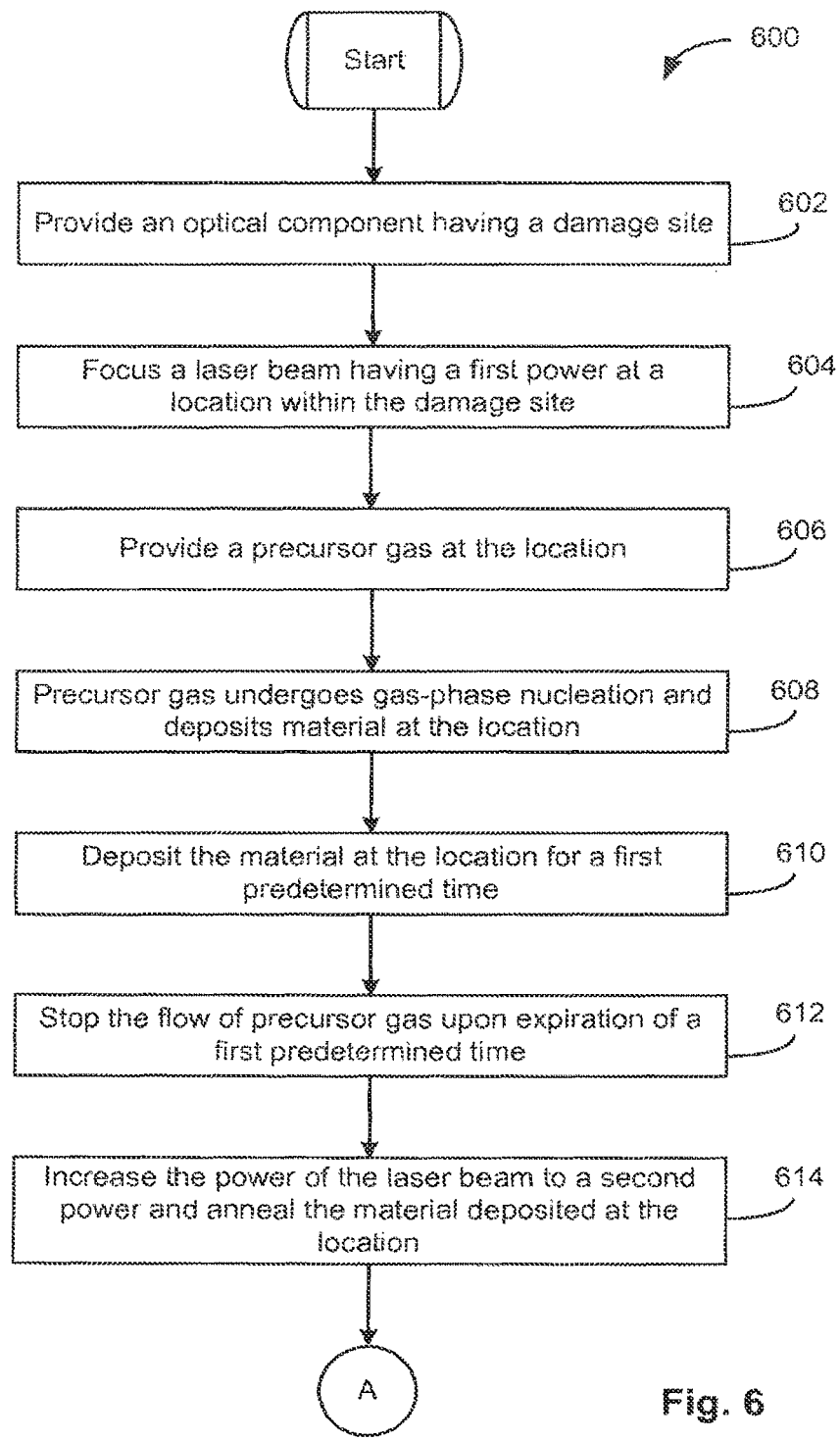

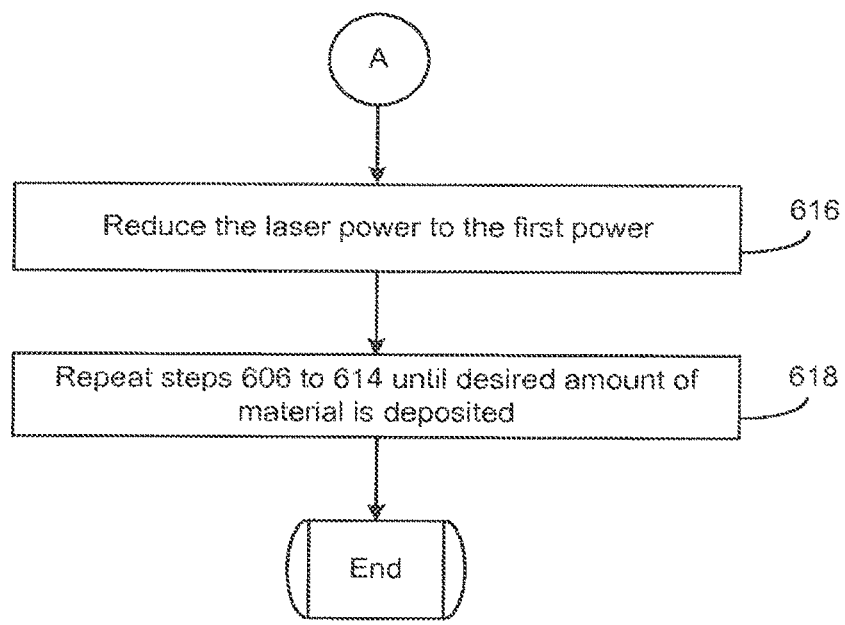
Fig. 6 Contd...

LOCALIZED ATMOSPHERIC LASER CHEMICAL VAPOR DEPOSITION

CROSS-REFERENCES TO RELATED APPLICATIONS

This application claims priority under 35 USC § 119(e) to U.S. Provisional Patent Application No. 61/637,205, filed on Apr. 23, 2012, the contents of which are incorporated by reference herein in their entirety for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND

Understanding and controlling optical damage in high energy laser systems remains a technologically challenging and scientifically complex problem. Over the years, various methods have been used to reduce or mitigate laser damage in optical components using high average power ultraviolet laser. In some conventional processes, mid- or far-infrared (IR) laser-based localized treatment of surface damage on fused silica lenses has been used to reduce or eliminate the observed shot-to-shot damage growth while producing optically-benign local morphologies with minimal residual stress. A particular method showed that the damage threshold of $CO_2$ laser treated silica can be greatly enhanced, presumably through annihilation of light absorbing defects, capillary-driven crack healing and toughening of the glass. In addition it has been observed that a sufficiently long ramp down in laser power will reduce any thermally-induced residual stresses to acceptable levels. However in most of the conventional damage mitigation techniques, a non-planar morphology associated with both the missing material of the original damage site and any additional material loss from laser processing necessarily leads to modulation of subsequent propagating UV light and the possibility of damaging other optics in the system.

In addition to minimal light modulation, satisfactory mitigation of optical damage requires low residual stresses, which can be accidentally introduced through heating, and maintaining at least as high a damage threshold as the original optical surface. Various laser-based methods which flow and remove damage material through evaporation have been used to arrest the damage and yield high damage threshold surfaces, but generally the residual stresses and morphology were far from ideal. Most recently, 'rapid evaporation' approaches (a.k.a. Rapid Ablation Mitigation, RAM), which 'machine' away damaged material using tightly-focused (~130 um) and high irradiance (>1 kW/cm$^2$) IR light may be used for both input and exit surface damage sites on wedge focus lenses. These methods limit the morphology to near cone shapes, devoid of rounded rim structures which tend to focus light downstream and result in ineffective mitigation. Furthermore, since the exposures are short in duration, a limited amount of heat is deposited and therefore residual stress is of less concern. In terms of up-scaling, however, increases in evaporated (a subsequent nanoparticle) material contamination can be a concern; both in terms of UV light absorption and damage initiation. Moreover, light intensification and scalability is still a challenge for laser machining methods, particularly when considering the interaction of mitigation sites with each other, other surface features (e.g., scratches) or laser beam modulation through interference of propagated UV light. Even in an ideal case of infinitely steep walls, i.e., an ideal obscuring aperture, it is well known that peak-to-mean intensifications can still result as high as 1:1.4 due to Fresnel diffraction. Specifically, the steep angles required to refract and defocus light incident on input mitigation sites places particular strain on the capability of current RAM protocols.

Minimally-evaporative approaches (T<2300 K) suggested by some conventional methods may be effective for limited-size single sites (<100 μm) and scratches but are difficult to scale along these dimensions due to thermocapillary effects which tend to scale with mitigated area and produce significant amounts of light intensification. As noted above, alternative 'rapid evaporation' approaches (T>3500 K), which precisely 'machine' away damaged material using tightly-focused (~130 μm) and high irradiance (>1 kW/cm2) IR light have also been considered for larger (100–500 μm diameter) damage sites. Excessive removal of material also leads to a highly modified optic which may make the optic unsuitable for its intended operation. In either evaporative or non-evaporative approaches, however, the resulting damage mitigation is necessarily limited to a finite incident light intensity due to the deviation from an ideal flat surface.

There is a need in the art for techniques to replace material lost in the original damage event with high damage threshold material and thus restore the integrity of the wave propagating media/optical component, e.g., by in-filling the lost material and restoring a planar surface.

SUMMARY

Embodiments of the present invention generally relate to material deposition. Specifically, certain embodiments of the present invention provided methods for depositing damage resistant silica at selected locations using established gas phase silica precursors, e.g., tetra ethyl ortho-silicate (TEOS), Silane or other suitable precurser, to locally deposit silica synthesized at the treated site using laser energy. The process used to locally deposit the silica according to the embodiments of the present invention can be referred to as laser-based chemical vapor deposition (LCVD).

In a particular embodiment, a typical LCVD material can be made less susceptible to optical damage under intense beam irradiation (i.e. increased in its optical damage threshold) by optimizing the deposition parameters such as the precursor/carrier gas flow and laser parameters. To make the process feasible in an industrial environment and to spatially control the localization of the deposited material, a particular embodiment includes use of a tunable $CO_2$ laser to heat the surface as the gas phase precursor is introduced co-axially along laser beam path towards the surface to react and polymerize the TEOS precursor into solid silica. The co-alignment of the laser beam and gas flow can be achieved using an optical nozzle apparatus in conjunction with a gas-liquid bubbler that is installed in-line, which will disperse the heated volatile precursor in a carrier gas. This localized LCVD process can be confined to the heated areas because the kinetics is strongly dependent on temperature. Therefore, outside of the laser-heated zone, no silica deposition occurs. A particular advantage of using techniques described herein is that a traditional CVD chamber is not necessary, thus reducing the cost and complexity of the deposition system. Moreover, the over-pressure of precursor gases at the laser heated spot maintains a relatively high level of cleanliness/purity for the deposited silica in the various embodiments of the present invention, a condition generally required for high grade optical components. One skilled in the art will realize that the apparatus described in the various embodiments of the present invention can be made arbitrarily small, with limits arising from a small Reynold's number and the diffraction limits of the IR light. Thus, the apparatus can be made mobile and on-demand, localized deposition of several 10's of microns of material may be deposited under ambient conditions.

Furthermore since TEOS gas molecules have an IR absorption band at ~980 cm$^{-1}$ (10.2 µm), laser tuning may be used as a means to increase gas-phase nucleation, precursor activation, and enhance deposition rates. Similarly, other precursor material absorption bands may be exploited in a similar way. It should be clear to one skilled in the art that other precursor material that includes refractive index shifting dopants such as boron or phosphorus may be used to alter final optical characteristics. In-filling resolution on the scale of the smallest beam size should be achievable: >10 µm laterally and >0.1 µm vertically depending on laser operating conditions and precursor gas flow rate. Additional reheating and melting of the surface may be applied to "polish" or anneal the added material shape in order to improve device characteristics (e.g., damage threshold).

Some embodiments of the present invention provide a method for depositing material in a highly localized manner. The method includes providing an optical component having one or more damage sites. Each of the one or more damage sites may be characterized by a pit with material missing from it. The method further includes focusing a laser beam at a location within a first damage site. At any instant in time, the laser beam is characterized by an output power and a beam diameter. Thereafter, the method includes setting the output power of the laser beam to a first output power and heating an area of the optical component at the location to a first temperature using the laser beam at the first output power. Once the area at the location is heated, a precursor gas is provided at the location and a first predetermined amount of material is deposited only at the area heated by the laser beam.

Certain other embodiments of the present invention provide an alternate method for depositing material at a damage site of an optical component. This method may include providing an optical component with a damage site and focusing a laser beam at the damage site. The laser beam is characterized by a beam diameter and an output power. Thereafter the method includes performing the steps of (a) setting the output power of the laser beam to a first power, (b) providing a precursor gas at the damage site, (c) depositing a layer of material at the damage site, (d) stopping the flow of precursor gas at the damage site, (e) setting the output power of the laser beam to a second power, and (f) annealing the layer of the material for a predetermined time. Steps (a)-(f) can be repeated after expiration of the predetermined time until a predetermined amount of material is deposited at the damage site. This method includes interleaving the annealing steps with deposition steps to obtain better control over the deposited material.

The following detailed description, together with the accompanying drawings will provide a better understanding of the nature and advantages of the present invention.

BRIEF DESCRIPTION OF THE DRAWINGS

FIG. 6 is a flow diagram of a process for depositing material according to another embodiment of the present invention.

DETAILED DESCRIPTION

Figure 1:
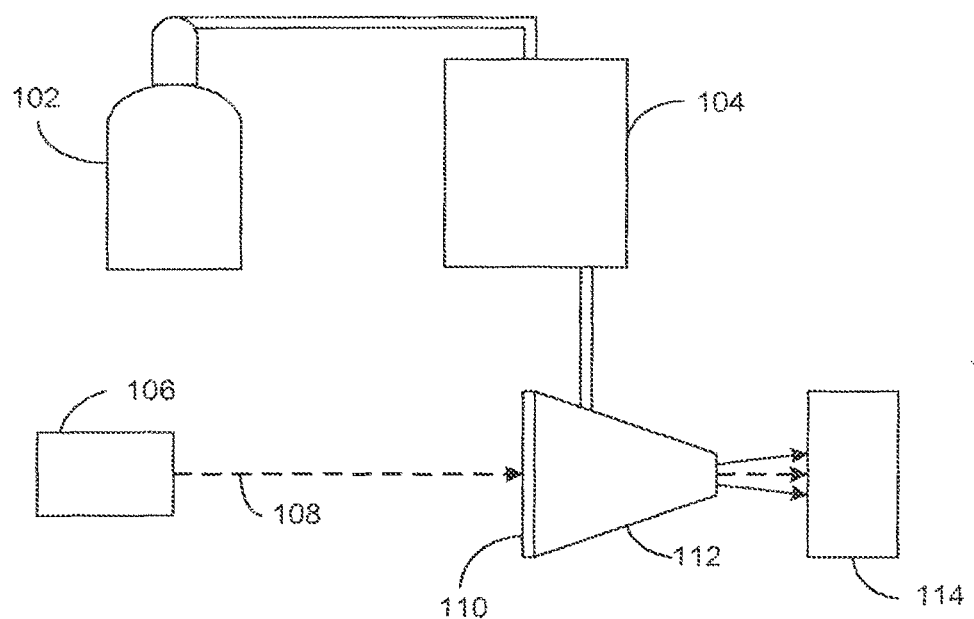
FIG. 1 is high-level block diagram of a system for performing localized deposition of material according to an embodiment of the present invention.

Embodiments of the present invention generally relate to deposition of material using laser-based deposition techniques. Certain embodiments of the present invention relate to deposition of silica. Specifically, some embodiments of the present invention relate to laser-based deposition of silica at optical damage sites of fused silica-based optical components. It is to be understood, however, that the embodiments are not limited to deposition of silica or deposition on optical components. One skilled in the art will realize that techniques described herein are applicable in any instance where a localized deposition of a material into existing voids is needed over a small area and with optimized damage characteristics.

In case of optical components, removal or reflow of material for the purpose of damage mitigation has been the focus of virtually every proposed laser-based mitigation attempt thus far. However, few attempts have been made to replace material lost in the original damage event and thus restore the integrity of the wavefront propagating media/optical component. As described above, CVD is a traditional technique that has been in use in the semiconductor industry for decades. CVD (or Chemical Vapor Deposition) includes depositing a layer of material over another material using temperature and/or plasma to effect reaction or decomposition of a precursor gas at or near the surface of a substrate resulting a layer of material to be deposited on the surface. Traditionally TEOS or Silane have been used as precursor gases to effect deposition of Silicon Dioxide ($SiO_2$) over a substrate. The silane is usually mixed with an oxidizer such as Nitrous Oxide ($N_2O$) or Oxygen ($O_2$). The chemical equations for the decomposition of these two precursors is given as:

$$SiH_4 + O_2 \rightarrow SiO_2 + 2H_2 \quad (1)$$

$$SiH_4 + 2N_2O \rightarrow SiO_2 + 2H_2 + 2N_2 \quad (2)$$

$$Si(OC_2H_5)_4 \rightarrow SiO_2 + 2(C_2H_5)_2O \quad (3)$$

The process of eq. (1) typically occurs at temperatures of about 300 C. The process of eq. (2) typically occurs at temperatures of about 650° C. However, the traditional CVD processes are suitable for deposition of blanket films or depositing material over a larger area, such as a semiconductor wafer substrate; however the conventional CVD process is unsuitable for localized deposition of material in an extremely small area, such as an optical damage site on an optical component. Furthermore, conventional CVD processes (including standard annealing at ~900° K) are not expected to produce very high damage threshold material needed in high power laser systems. Embodiments of the present invention provide techniques for localized deposition of material using a CVD technique while avoiding the cost, disadvantages, and complexity of a traditional chamber-based low pressure CVD apparatus.

When depositing high damage threshold $SiO_2$ using TEOS precursor, defects and surface chemistry that may lead to optical absorption and subsequent damage may need to be controlled. For example, residual amorphous C:H impurities derived from non-volitalized ethanol groups can absorb strongly in the visible spectrum while graphitic carbon has a near zero band gap and can readily absorb most of the UV-Visible spectrum. Additionally, a high concentration of intrinsic non-bridging oxygen defects (and silanol groups) resulting from incomplete polymerization can also lead to mid-gap states in $SiO_2$ (Silicon Dioxide) and has been associated with laser-induced damage. On the other hand, extremely high-purity and low-loss silica can be fabricated using modified-CVD processing, to include laser-based annealing as described herein, leading to significant advances in optical fiber communications, photonic band gap devices, and not the least, high power laser systems.

FIG. 1 is a high-level block diagram of a system 100 for performing localized deposition of material according to an embodiment of the present invention.

System 100 includes a carrier gas reservoir 102. Carrier gas reservoir can include a carrier gas such as Nitrogen, Argon, Helium, or any of the other inert gases. Alternatively, reactive gases such as air, $O_2$, $N_2O$ or $O_3$ may also be used as the carrier gas to enhance deposition rates. System 100 can further include a precursor reservoir 104 that contains a precursor such as silane or TEOS. It is to be noted that any other suitable precursor may also be used based on the application. If TEOS is used as a precursor, it is usually stored in a liquid form and mixed with the carrier gas by liquid/vapor exchange before being transported to nozzle 112 via a heated gas line (to prevent condensation during transport). System 100 can further include a laser source 106 that generates a laser beam 108. In a particular embodiment a $CO_2$ laser may be used, although various other lasers may also be used based on the material to be deposited and the surface on which the material is to be deposited. Laser beam 108 passes via an optical window 110 coupled to nozzle 112. A mixture of the carrier gas and the precursor is introduced into nozzle 112. The mixture of the carrier gas and the precursor flows through the nozzle and towards the surface of substrate 114. Laser beam 108 is focused at a point on the surface of substrate 114. In some embodiments, nozzle 112 is placed between 8 mm and 15 mm from the surface of substrate 114 in a direction perpendicular to substrate 114. In some embodiments, the $1/e^2$ diameter of laser beam 108 is between 700 µm and 3 mm. In some embodiments, the precursor gas is flowed at between 0.2 and 0.6 L/min and having a concentration of about 0.0863 mole/m³. In some embodiments, the energy of laser beam 108 is between 1 watt and 10 watts.

Figure 2:
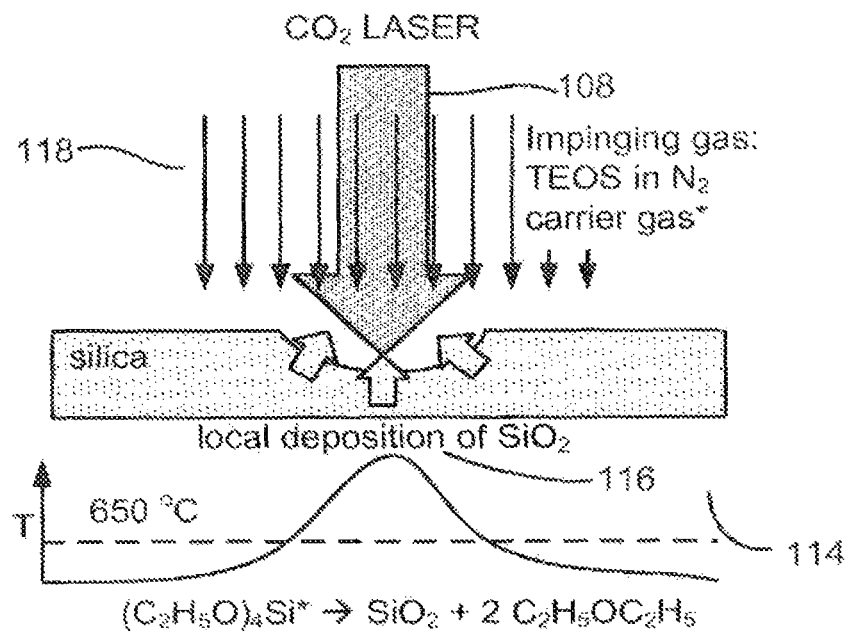
FIG. 2 illustrates the mechanism of laser-based deposition according to an embodiment of the present invention.

System 100 can be used to deposit material at a specific local site, which is not possible with traditional CVD techniques. The various embodiments of the invention are described in this specification using a silica-based optical component as an example. However, it is to be noted that the embodiments described herein are not limited to silica-based optical components and can be used for deposition of various other materials. Consider that substrate 114 is a silica-based optical component having an optical damage site 116, as illustrated in FIG. 2. In operation, laser beam 108 can be focused at damage site 116. A mixture of TEOS precursor and a carrier gas 118 is provided at the surface of substrate 114. Laser beam 108 heats damage site 116 but does not heat any other portion of substrate 114. In some embodiments, the temperature at damage site 116 can reach between 900° K and 2500° K. At these temperatures, the TEOS decomposes, e.g., per equation (3) above, and silica is deposited at damage site 116. FIG. 2 also slows the deposition profile of the deposited silica. Since laser beam 108 is focused only at damage site 116, the silica deposition occurs only at the damage site. Even though TEOS may come in contact with other areas of the surface of substrate 114, no deposition occurs in those regions since the temperature needed for the chemical reaction of occur is not present in these regions. In other words, the localized TEOS-based CVD process is confined to the heated areas because the kinetics are strongly dependent on temperature and therefore, outside of the laser-heated zone, there is no silica formation. Thus, highly localized deposition of silica can be achieved using embodiments of the present invention. In addition, it would be undesirable to heat the entire optic to the deposition temperature, as is needed in a traditional CVD process, since heating the entire optic will lead to deformation of the optic and some cases may make the optic completely un-usable for its intended purpose. System 100 helps to avoid these issues by localized heating of the subsrtrate and localized deposition of silica (and other materials).

Figure 3:
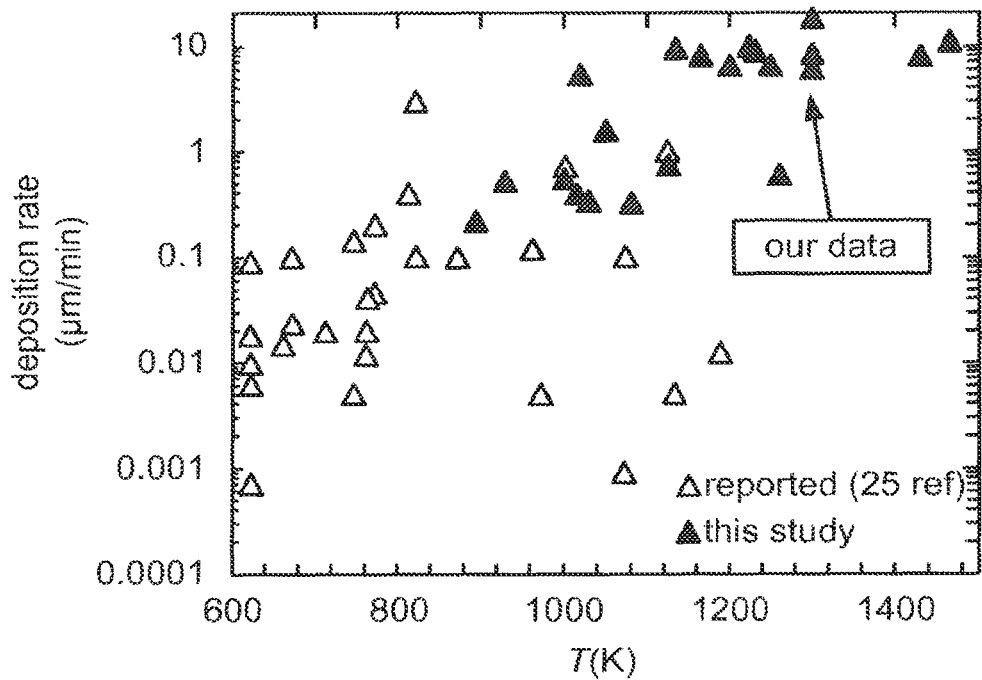
FIG. 3 illustrates a graph of temperature vs. deposition rate according to an embodiment of the present invention.

One of the advantages of the techniques described herein compared to traditional CVD method is the compartively high rates of deposition that can be achieved using embodiments of the present invention. FIG. 3 illustrates a graph of temperature vs. deposition rate. As can be seen, TEOS deposition rates of up to 22 µm/min can be achieved using embodiments of the present invention, which is not possible with traditional CVD methods. These enhanced rates are achieved by the high temperatures accessible with laser heating (much more difficult to obtain cleanly with furnace based reactors), and by the small size of the beam, which allows faster 3D diffusion, as opposed to the much slower planar 2D diffusion from conventional CVD systems. The non-uniformity of the deposited material can be between 1% and 5%.

Figure 4:
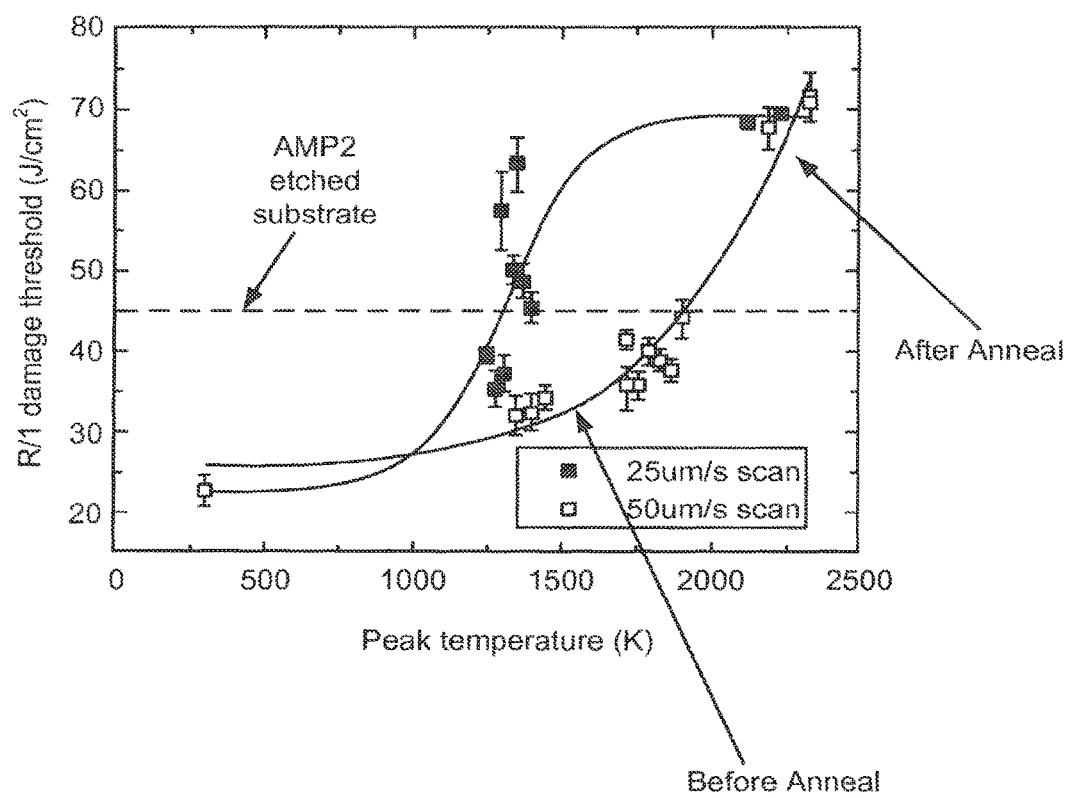
FIG. 4 illustrates the benefit of annealing the deposited material compared to normally etched substrate of a silcia-based optic according to an embodiment of the present invention.

In some embodiments, after the silica is deposited at the damage site, the deposited silica can be annealed to smooth the surface and increase the damage threshold for the deposited material. In some embodiments, the same laser beam used for the deposition can be used for annealing the deposited material. In a particular embodiment, a laser beam having an output between 5 and 20 watts and having a $1/e^2$ beam diameter of about 3 mm can be used to anneal the deposited silica. In some embodiments, the temperature at which the annealing occurs can be between 1500-2500° K. Such temperatures are not achievable in a conventional anneal process and thus any optical material deposited using conventional CVD and anneal processes is unlikely to withstand high fluence laser-based operations. In an embodiment, the annealing is performed after the deposition has been completed, circumventing any beam registration issues since the same beam is used for deposition and annealing. In an alternative embodiment, one or more annealing steps can be interleaved or alternated with one or more LCVD deposition steps to further obtain a more conformal deposition of the material with increased damaged threshold. Furthermore, by interlacing smaller deposition volumes with laser anneal steps, heat coupling is performed by the much more rapid optical absorption of the laser (~3 µm absorption depth for silica at a wavelength of about 10.6 µm), instead of relying on thermal diffusion through the bulk of the a large deposited mass, which requires larger temperatures and temperature gradients to achieve deep annealing of the CVD material. For example, in this instance, a partial deposition may be performed followed by an annealing step. Thereafter another deposition step may be performed followed by another annealing step. It is to be understood that there may be multiple deposition steps interleaved with multiple annealing steps. These anneal steps are performed in-situ with no need to move the substrate/optical component to a separate machine/system. The system that performs the deposition can also perform the annealing with minor changes in the laser beam parameters. The time duration for the annealing can be between 1 min and 5 mins depending on the area of the damage site and the amount of material deposited. The larger the area of the damage site and/or the more the amount of material deposited, a longer anneal time may be needed. Moreover, the parameters used in each of the annealing step may differ between the multiple annealing steps. FIG. 4 illustrates the benefit of annealing the deposited material compared to normally etched substrate of a silcia-based optic.

As can be seen in FIG. 4, a carefully etched substrate has a R/1 surface damage threshold of about 45 J/cm$^2$ and represents the state-of-the-art in terms of UV optical damage resistance. After deposition of silica and annealing at temperatures of 2000° K or higher, the surface damage threshold for the deposited material was increased to between 65 and 75 J/cm$^2$, which is more than a 40% increase in the damage threshold and closer to the instrine bulk damage threshold of fused silica. This is significant since none of conventional damage mitigation techniques can increase the damage threshold for the damage site by such a huge amount. Several advantages are realized by performing the annealing and in particular with interleaved annealing. One big advantage is that time for individual annealing of each deposition substep is smaller thereby decreasing the overall time needed to complete the deposition. In addition, by interleaving the annealing steps with the deposition steps gives a better control on the overall process and results in a final deposition profile that yields a flat to near flat surface upon completion of the deposition.

In order to get the optimal deposition rate and uniform deposition of material, the laser beam may be aligned with the damage site such that the laser beam is focused at approximately the center of the damage site/region. In order to ensure that the laser beam is properly aligned with the damage site (or pit), the laser beam is focused at the damage site and the reflected light from the laser beam (e.g., 10.6 µm light) is observed to determine whether the reflected light is from a flat surface or from a non-flat surface. Based on this determination, the laser beam is properly aligned with the damage site (which usually will be a non-flat surface). This can be accomplished by imaging the illuminated damage site/pit through an optical system with a finite aperture in the Fourier plane: the higher wavevectors associated with reflection from a non-planar surface will not be completely imaged resulting in a 'donut hole' intensity pattern at the image plane. While this is a simple and straightforward method which utilizes the IR laser light directly, other methods, e.g., inteferometry, could be used to align the pit with the thermal expansion caused by the laser heating.

In another embodiment, the surface shape is monitored continuously for determining complete filling and ensuring maximum planarity following the deposition. Various methods exist for achieving in-situ surface monitoring such as interferometry and probe beam deflection. Direct analysis of a propagating beam (e.g., from a UV laser) has the advantage that, although path length may vary independently with surface height and refractive index of the deposited material, the final phase profile can be analyzed during deposition to ensure suitable propagation of UV light in the final mitigated site.

Figure 5:
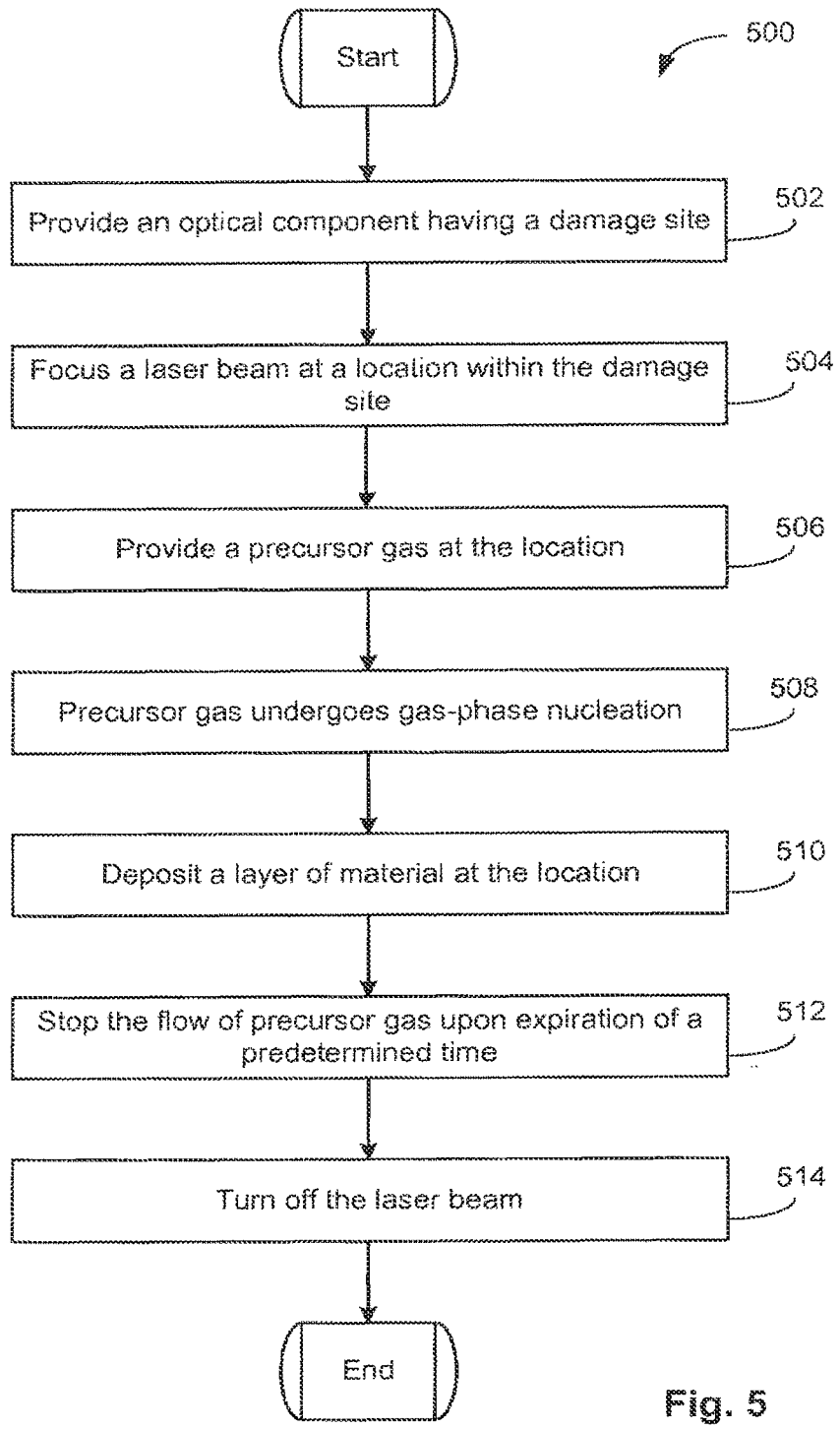
FIG. 5 is a flow diagram of a process for depositing material according to an embodiment of the present invention.

It should be appreciated that the specific steps illustrated in FIG. 5 provide a particular method of depositing material according to an embodiment of the present invention. Other sequences of steps may also be performed according to alternative embodiments. For example, alternative embodiments of the present invention may perform the steps outlined above in a different order. For example, in an embodiment, after the deposition is completed, the same laser beam (with different power output) may be used to anneal the newly deposited material to enhance its damage threshold as described above. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

In some embodiments, a fixed laser beam is used for the entire deposition process. For example, the laser beam is focused at a single point in the damage site during the entire deposition process. This approach is particularly suitable for smaller damage site, e.g., having an area that can be entirely or substantially covered by the beam diameter. In an alternative embodiment, a moving laser beam may be used. In this embodiment, the laser beam is positioned/focused at a first location of the damage site and material deposition is performed, e.g., as illustrated in FIG. 5. Once the predetermined time has expired, the laser beam is focused at a second location of the damage site and the entire process of deposition is repeated. This process can be repeated several times by refocusing the laser beam at different locations in the damage site to deposit material at those locations. This approach may be suitable for larger damage sites. In some embodiments, an anneal step (as described above) may follow after the deposition at each location.

It is beneficial to accurately monitor the temperature at the location where the laser beam is pointed/focused since the temperature directly affects the deposition rate of the material. In general, the higher the temperature is the higher the deposition rate. However, in order to properly "fill" the damage site/pit precise control on the deposition rate is needed so that damage site is neither 'under-filled' nor 'overfilled'. Both under-fill and overfill can cause problems in the operation of the optical component. Therefore, it is beneficial to accurately determine the temperature at the focus point of the laser, which in turn leads to an accurate determination of amount of deposited material. In steady state laser heating where the laser light is absorbed over a length much smaller than the beam size, the temperature rise, $\Delta T$ is linearly proportional to the absorbed laser power $P_a$, inversely proportional to the thermal conductivity k of the substrate/optical component material and also inversely proportional to the beam size a.

$$\Delta T = \frac{P_a}{2ak\sqrt{\pi}} \quad (4)$$

Thus, when the laser power, thermal conductivity of the material, and the beam size is known, the temperature as a function of laser power can be estimated. Eq. (4) above does not take into account transport contributions from radiation and convection, which tend to be small in comparison with the large convective transport associated with laser-driven radial temperature gradients. Thus, at any given power level of the laser beam, the temperature (and thus the deposition rate) can be known. So, if a change in deposition rate is needed, the laser power can be appropriately adjusted to get the desired deposition rate.

In a particular embodiment, temperature at the deposition site is continuously estimated, e.g., by knowing the power output of the laser, in-situ during a deposition cycle. In other words, the deposition rate as function of the laser power is continuously determined during the deposition process and when a predetermined amount of material is deposited, the laser beam is turned off. In some embodiments, the laser beam output may not be stable and the power may vary as a function of time. Estimating the temperature/deposition rate continuously during the deposition process provides more control on the process and helps with the 'under-fill' and 'overfill' issues described above.

In another embodiment, the surface shape is monitored continuously for determining complete filling and ensuring maximum planarity following the deposition. Various methods exist for achieving in-situ surface monitoring such as interferometry and probe beam deflection. Direct analysis of a propagating beam (e.g., from a UV laser) has the advantage that, although path length may vary independently with surface height and refractive index of the deposited material, the final phase profile can be analyzed during deposition to ensure suitable propagation of UV light in the final mitigated site.

FIG. 6 is a flow diagram of a process 600 for depositing material according to another embodiment of the present invention. At step 602, an optical component with a damage site/pit is provided at atmospheric pressure. In some embodiments, the damage site may be pre-treated to form a Gaussian profile for the damage site, as described above. At step 604, a laser beam is focused at a point within the damage site to heat the damage site to deposition temperature as described above. In some embodiments, the laser beam may have a beam size of between 1 mm and 2 mm and a power of between 1 watt and 2 watts. At step 606, TEOS gas is introduced at the damage site. At step 608, TEOS dissociates due to the temperature at the damage site and silica starts depositing at the damage site. After a predetermined time elapses at step 610, the TEOS flow is stopped at step 612. Thereafter, at step 614, the laser power is increased to between 4 watts and 6 watts and the area where the silica was deposited is annealed. During annealing, the temperature of the area where silica was deposited increases from about 1200-1700° K to between 2000° K and 2500° K. The deposited material is then annealed using the same laser beam for a predetermined time, e.g., up to 5 mins. After the annealing is completed, the laser power is again reduced to between 1 and 2 watts and TEOS flow is started again to enable deposition of additional silica at the same location, at step 616. After the second round of silica deposition, the TEOS gas flow is stopped and the newly deposited silica is again annealed as in step 614. This process can be repeated several times until the damage site is completely filled with the desired amount of silica (step 618) at which point the process ends.

It should be appreciated that the specific steps illustrated in FIG. 6 provide a particular method of depositing material according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. For example, in some embodiments, a moving laser beam, similar to the one described above, may be used to effect both the deposition and the anneal steps. Furthermore, additional steps may be added or removed depending on the particular applications. One of ordinary skill in the art would recognize many variations, modifications, and alternatives.

Figure 7:
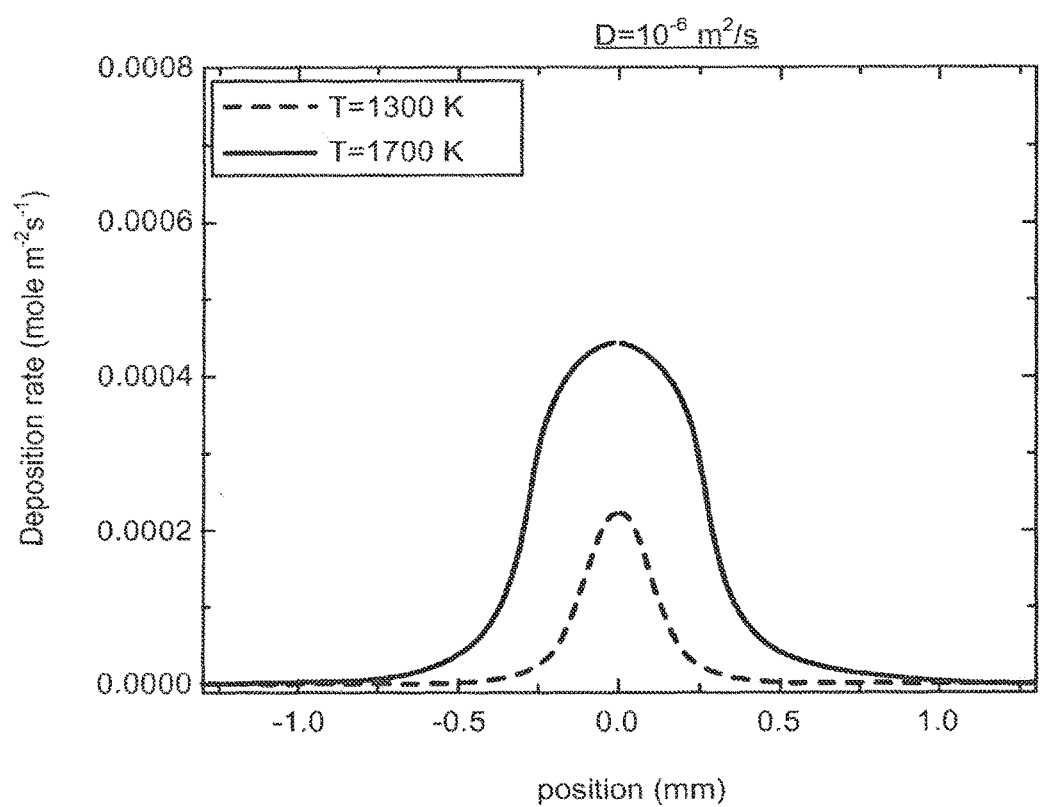
FIG. 7 illustrates profile of deposited material at various temperatures for a precursor gas molecule having a low diffusivity, according to an embodiment of the present invention.
Figure 8:
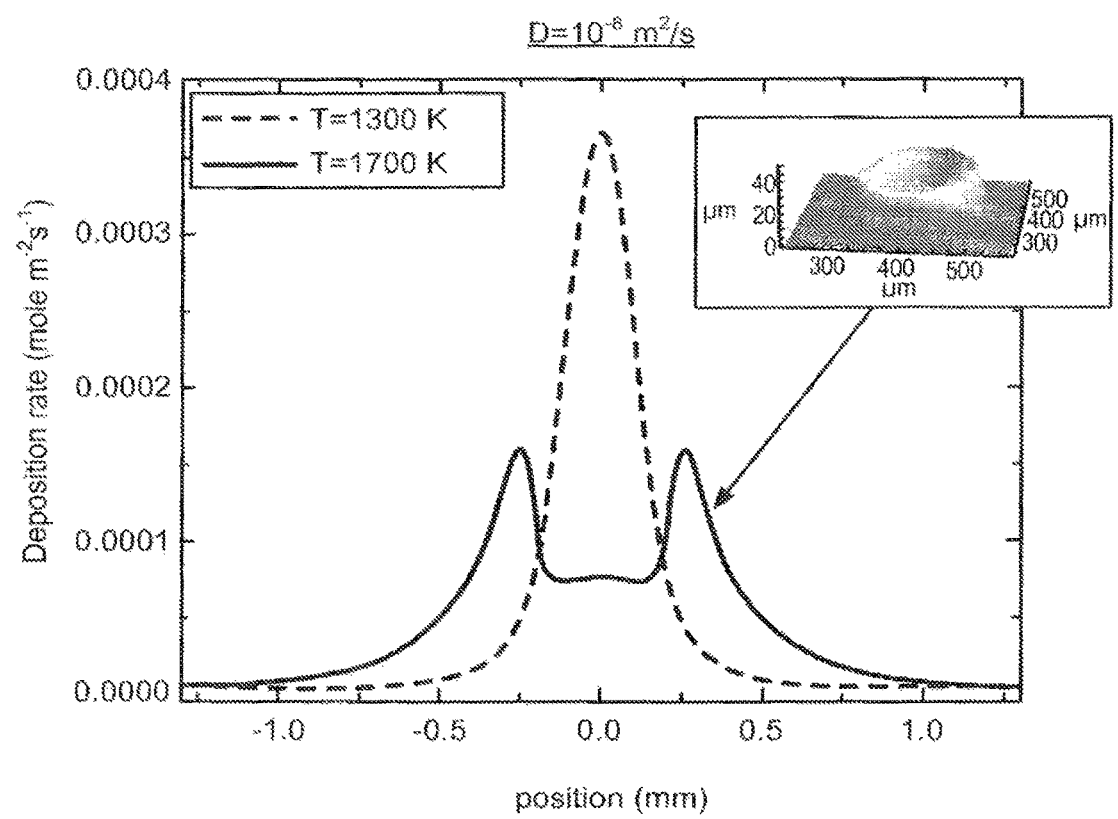
FIG. 8 illustrates profile of deposited material at various temperatures for a precursor gas molecule having a high diffusivity, according to an embodiment of the present invention.

As discussed above, the deposition rate is dependent on the temperature. In general, higher temperature leads to higher deposition rates. However, the deposition profile is equally important in order to properly fill the damage site. The deposition profile in turn depends on gas molecule diffusivity of the precursor gas used in the deposition process. In the case where the diffusivity is smaller, e.g., about $10^{-6}$ m$^2$/s, the fixed-beam deposition profile has a Gaussian shape as illustrated in FIG. 7. In this case, higher temperature results in a higher deposition rate without much change in the deposition profile. As can be seen from FIG. 7, the deposition rate at 1700° K is higher than the deposition rate at 1300° K without much difference in the deposition profile. However, when the gas molecule diffusivity is higher, e.g., about $10^{-8}$ m$^2$/s, for example when the precursor molecules start to polymerize and get larger in the gas phase, the higher temperature results in a non-Gaussian profile as illustrated in FIG. 8. The resulting 'volcano' shaped deposition profile illustrated in FIG. 8 may result in an uneven filling of the damage site, which usually will be pretreated to a steady-state Gaussian profile, e.g., using laser beam heating. The uneven filling of the damage site may lead to undesirable optical characteristics for the optical component. It is beneficial to match the deposition profile with the profile of the damage site. In one embodiment, the damage site is pre-treated to create a Gaussian profile and the deposition profile is matched to the damage site profile to get uniform deposition of material into the damage site.

Figure 9:
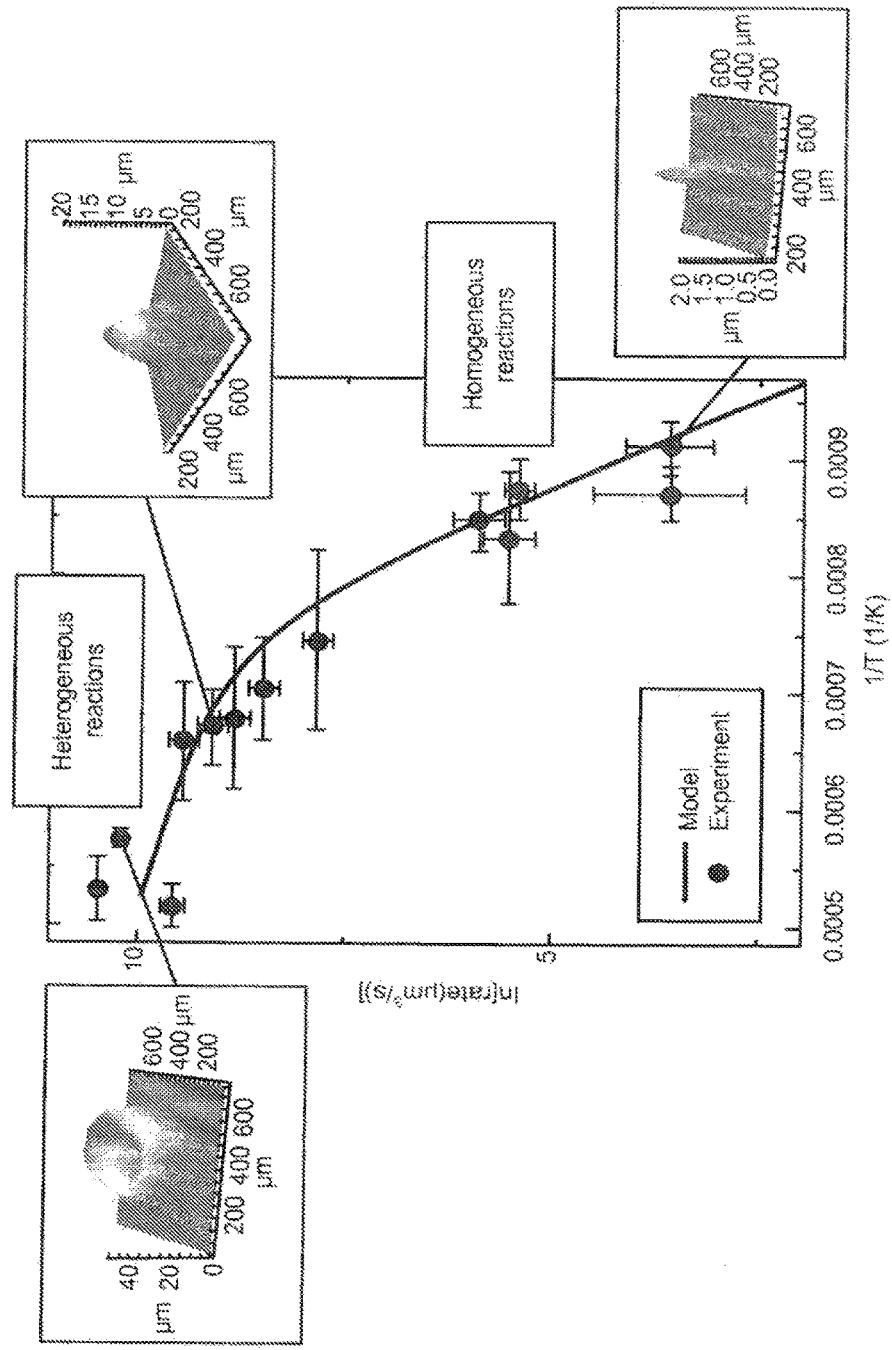
FIG. 9 illustrates relationship between temperature, deposition rates, and deposition profiles according to an embodiment of the present invention.

FIG. 9 illustrates relationship between temperature and deposition profiles using deposition techniques described herein. FIG. 9 also shows the deposition profiles obtained at various combinations of temperature and deposition rates. Depending on the profile of the damage site, the temperature and deposition rates can be adjusted to match the profile of the damage site. As can be seen from FIG. 9, the deposition profile at l/T value of between 0.00065° K and 0.0007° K (or roughly a temperature of between 1300° K and 1500° K) provides a deposition profile that has a Gaussian shape with a high deposition rate. In contrast, higher LCVD deposition temperatures tend to produce volcano shaped structures on the surface.

It is to be noted that although embodiments of the present invention have been described with reference to depositing silica in damage sites of an optical component, the embodiments are not limited to depositing silica. The techniques described in this application are equally applicable to depositing other types of materials such as borophosphates, borosilicate, phosphate glass, doped absorbing or amplifier glasses, and any other material which can be made from liquid-phase precursor. In other embodiments, the techniques described herein can be used to pattern or write waveguides on a surface of the substrate. In such an application, the annealing and/or precursor chemistry can be adjusted to produce LCVD materials of slightly different density and refractive index than the substrate.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method for repairing a damage site on an optical component, the method comprising:
   providing a nozzle for receiving both a laser beam and stream of a precursor gas, and for focusing the precursor gas into a stream, the precursor gas including at least one of Silane or Tetra Ethyl Ortho-Silicate (TEOS);
   positioning the nozzle and an optical component in free space, the nozzle further being positioned adjacent to a surface of the optical component, damage site is characterized by a pit which forms a volume from which material of the optical component is missing;
   Confirming that the laser beam is focused on the damage site by using a focusing mechanism to focus the laser beam at the damage site to create a reflected laser beam, the reflected laser beam including characteristics that are identifiable by an optical system and which indicate that the laser beam is being reflected from a non-flat surface;
   preparing the damage site by ablating away a portion of material which forms the damage site to impart a roughly Gaussian profile to the damage site;
   after the damage site has been prepared to have a roughly Gaussian profile, focusing the laser beam at a location within the damage site, the laser beam being characterized by an output power and a beam diameter, with the laser beam being focused along an axis perpendicular to a surface of the optical component and the beam diameter being sufficiently small to permit focusing of the laser beam to only irradiating the damage site;
   setting the output power of the laser beam to a first output power;
   using the laser beam at the first output power to heat only the damage site to a first temperature while leaving areas around the damage site below the first temperature;
   providing the precursor gas to the nozzle such that the precursor gas is focused by the nozzle to flow in a stream coaxial to the laser beam, and is directed at the damage site of the optical component, and perpendicular to the surface of the optical component; and
   using the laser beam to heat only a portion of the precursor gas residing over the the damage site, which results in a deposition of a first predetermined amount of material only at the damage site, while portions of the precursor gas surrounding the damage site are not heated sufficiently by the laser beam to cause the precursor gas to change to a solid, thus leaving the surface around the damage site unmodified.

2. The method of claim 1 further comprising:
   after the depositing, increasing the output power of the laser beam to a second output power to heat the damage site to a second temperature; and
   annealing the first predetermined amount of material for a predetermined time using the laser beam.

3. The method of claim 2 wherein the predetermined time is between 3 minutes and 5 minutes.

4. The method of claim 2 wherein the second temperature is between 2000° K and 2500° K.

5. The method of claim 2 wherein the second output power is about 5 watts.

6. The method of claim 1 wherein the first output power is between 1 and 2 watts.

7. The method of claim 1 wherein the first temperature is between 1200° K and 1700° K.

8. The method of claim 1 further comprising:
   after the depositing, focusing the laser beam at a new location within the damage site;
   heating an area of the optical component at the new location to the first temperature using the laser beam at the first output power;
   providing a precursor gas at the new location; and
   depositing a second predetermined amount of material only at the area of the optical component at the new location.

9. A method for repairing a damage site on a surface of an optical component positioned in free space, the method comprising:
   arranging a nozzle in free space adjacent the damage site;
   focusing a laser beam through an optical window of the nozzle at the damage site, the laser beam being characterized by a beam diameter and an output power, and the laser beam being focused along an axis perpendicular to the surface of the optical component at a location within an area defined by the damage site;
   confirming that the laser beam is focused at the location by examining a reflected portion of light produced by the laser beam which is reflected from the damage site, and using the reflected portion of light to determine whether the reflected portion of light has been reflected from a flat surface or a non-flat surface;
   after the laser beam has been confirmed as being focused on a non-flat surface, then
   (a) setting the output power of the laser beam to a first power;
   (b) directing a precursor gas, which flows through the nozzle and is focused by the nozzle, at the damage site, the precursor gas being focused along an axis of the nozzle and perpendicularly to the surface of the optical component;

(c) using the laser beam to heat a portion of the precursor gas residing over the damage site, which causes a deposition of a layer of material at the damage site, wherein the material is generated by dissociation of the precursor gas, and wherein portions of the precursor gas not residing over the damage site are not heated by the laser beam and therefore are not deposited as a solid on the surface of the optical component, and wherein the precursor gas is formed by one of Silane or Tetra Ethyl Ortho-Silicate (TEOS);

(d) stopping a flow of the precursor gas at the damage site;

(e) setting the output power of the laser beam to a second power;

(f) annealing the layer of the material for a predetermined time; and repeating steps (a)-(f) after expiration of the predetermined time until a predetermined amount of material is deposited at the damage site.

10. The method of claim 9 wherein depositing the layer of the material further comprises:

heating the damage site to a temperature of between 1200° K and 1500° K; and causing dissociation of the precursor gas to generate a plurality of molecules of the material.

11. The method of claim 9, wherein annealing the layer of the material comprises heating the layer of material to a temperature of between 2000° K and 2500° K.

12. The method of claim 9, wherein the predetermined time is between 3 and 5 minutes.

13. The method of claim 9, wherein focusing the laser beam at the damage site further comprises:

focusing the laser beam at a first location within the damage site; and after depositing the predetermine amount of material at the first location, focusing the laser beam at a second location within the damage site.

14. A system for repairing a damage site on a surface of a substrate, the system comprising:

a gas delivery system including a nozzle, the nozzle being positioned in free space adjacent the damage site and having an axis arranged perpendicular to the surface of the substrate;

a laser source configured to output a laser beam having an output power and a beam diameter;

a focusing mechanism for focusing the laser beam at a location forming the damage site on the substrate, the substrate being positioned in free space, and the laser beam further being focused along an axis perpendicular to a surface of the substrate;

the focusing mechanism configured to focus the laser beam at the location to provide reflected light from the damage site, wherein the reflected portion of light includes characteristics which are imaged by an optical system to identify that the reflected portion of light has been reflected from a non-flat surface;

the nozzle further being configured for receiving, focusing and delivering a precursor gas including at least one of Tetra Ethyl Ortho-Silicate (TEOS), as a stream which flows coaxial with the laser beam, and along the axis so that the stream impinges the damage site on the surface, perpendicularly to the surface, and wherein the system is configured to:

output the laser beam at a first output power;

use the laser beam to heat the damage site on the substrate, and only the precursor gas residing over the damage site, to a first temperature;

Cause dissociation of only the precursor gas residing over the damage site, while other portions of the precursor gas not present over the damage site are not heated to cause dissociation;

deposit a layer of material only at the damage site;

output the laser beam at a second output power, and anneal the deposited layer for a predetermined time at a second temperature.

15. The system of claim 14 wherein the first output power is between 1 and 2 watts and the second output power is about 5 watts.

16. The system of claim 14 wherein the beam diameter is between 700 μm and 3 mm.

17. The system of claim 14 wherein the gas delivery system includes a nozzle placed between 8 and 13 mm away from the damage site on the substrate in a direction perpendicular to the surface of the substrate.

18. The system of claim 14 wherein the second temperature is about 2000° K and the predetermined time for annealing is between 3 and 5 minutes.

* * * * *